(12) United States Patent
Zhou et al.

(10) Patent No.: US 10,682,758 B2
(45) Date of Patent: Jun. 16, 2020

(54) NUMERICAL METHOD FOR OBTAINING THE INVERSE KINEMATICS OF SIX-DEGREE-OF-FREEDOM SERIAL ROBOT WITH AN OFFSET WRIST

(71) Applicants: Foshan Huashu Robotics Co.,Ltd., Foshan (CN); Foshan Institute of Intelligent Equipment Technology, Foshan (CN)

(72) Inventors: Xing Zhou, Foshan (CN); Tongshu Chen, Foshan (CN); Shifeng Huang, Foshan (CN); Simin Chen, Foshan (CN); Lin Yang, Foshan (CN); Xugao Deng, Foshan (CN); Haibin Yang, Foshan (CN); Qun Wang, Foshan (CN)

(73) Assignees: Foshan Huashu Robotics Co., Ltd., Foshan (CN); Foshan Institute of Intelligent Equipment Technology, Foshan (CN)

( * ) Notice: Subject to any disclaimer, the term of this patent is extended or adjusted under 35 U.S.C. 154(b) by 302 days.

(21) Appl. No.: 15/893,067

(22) Filed: Feb. 9, 2018

(65) Prior Publication Data

US 2019/0111562 A1   Apr. 18, 2019

(30) Foreign Application Priority Data

Oct. 18, 2017   (CN) .......................... 2017 1 0969628

(51) Int. Cl.
*B25J 9/16*      (2006.01)
*G06F 17/16*    (2006.01)
*G06F 30/00*    (2020.01)

(52) U.S. Cl.
CPC ............ *B25J 9/1607* (2013.01); *G06F 17/16* (2013.01); *G06F 30/00* (2020.01);
(Continued)

(58) Field of Classification Search
CPC ........ B25J 9/1607; G06F 30/00; G06F 17/16; G05B 2219/39028; G05B 2219/39062; G05B 2219/39417; Y10S 901/02
See application file for complete search history.

(56) References Cited

U.S. PATENT DOCUMENTS 4,604,716 A * 8/1986 Kato ...................... G05B 19/41
                                                 318/567
5,294,873 A * 3/1994 Seraji .................... B25J 9/1638
                                                 318/561

(Continued)

*Primary Examiner* — Nicholas Kiswanto
(74) *Attorney, Agent, or Firm* — Millen, White, Zelano & Branigan, P.C.; William Nixon

(57) ABSTRACT

Disclosed is a method for obtaining the inverse kinematics of a six-degree-of-freedom serial robot with an offset wrist. The method uses the analytical solution of the inverse kinematics of the six-degree-of-freedom serial robot with a non-offset wrist as an approximate solution of the inverse kinematics of the six-degree-of-freedom serial robot with an offset wrist and an initial point for iteration, and obtains a numerical solution of the inverse kinematics of the six-degree-of-freedom serial robot with an offset wrist meeting the accuracy through continuously iterative approaching. The present disclosure has faster convergence and less calculation amount relative to the traditional calculation method, reduces the computation burden for a robot controller, and improves the real-time performance.

6 Claims, 4 Drawing Sheets

(52) U.S. Cl.
CPC .............. *G05B 2219/39028* (2013.01); *G05B 2219/39062* (2013.01); *G05B 2219/39417* (2013.01); *Y10S 901/02* (2013.01)

(56) References Cited

U.S. PATENT DOCUMENTS

| | | | | |
|---|---|---|---|---|
| 5,737,500 | A * | 4/1998 | Seraji | B25J 9/1643 |
| | | | | 318/568.11 |
| 5,831,875 | A * | 11/1998 | Hirata | G06F 30/17 |
| | | | | 703/7 |
| 7,756,606 | B2 * | 7/2010 | Nakajima | B25J 9/1643 |
| | | | | 700/245 |
| 9,868,209 | B2 * | 1/2018 | Gomi | B25J 9/1641 |
| 9,878,447 | B2 * | 1/2018 | Thibodeau | G05B 19/408 |
| 10,022,868 | B2 * | 7/2018 | Hida | B25J 9/1664 |

* cited by examiner

NUMERICAL METHOD FOR OBTAINING THE INVERSE KINEMATICS OF SIX-DEGREE-OF-FREEDOM SERIAL ROBOT WITH AN OFFSET WRIST

TECHNICAL FIELD

The present disclosure relates to an inverse kinematics calculation method of an industrial robot, and more particularly, to an inverse kinematics calculation method of a six-degree-of-freedom serial robot with an offset wrist.

BACKGROUND

The inverse kinematics of a robot is the premise and basis of trajectory planning, controlling and other aspects. Generally, a non-offset wrist is usually used for a six-degree-of-freedom serial robot to obtain an analytical solution, but it cannot realize the 360-degree rotation of a middle joint, and has low structure rigidity. Therefore, during actual production process, it is often replaced by a six-degree-of-freedom serial robot with an offset wrist. However, the inverse kinematics of six-degree-of-freedom serial robot with an offset wrist above usually has numerical solution without any analytical solution. The geometric method and algebraic elimination method, as well as optimization methods such as tabu searching method or hill-climbing method are used in the existing solution algorithm for the inverse kinematics of the six-degree-of-freedom serial robot with an offset wrist, but the algorithms above need a large amount of calculation, which causes great burden to a robot controller and poor real-time performance.

SUMMARY

In order to solve the problem above, the present disclosure provides a numerical method for obtaining the inverse kinematics of a six-degree-of-freedom serial robot with an offset wrist, which can quickly obtain the numerical solution of the inverse kinematics, reduce the computation amount for the robot controller, and improve the real-time performance.

The solution of the present disclosure to solve the technical problem thereof is as follows:

A numerical method for obtaining the inverse kinematics of a six-degree-of-freedom serial robot with an offset wrist, comprising the following steps:

A. use the pose of the terminal coordinate frame of the six-degree-of-freedom serial robot with an offset wrist as the pose of the terminal coordinate frame of a six-degree-of-freedom serial robot with a non-offset wrist to obtain an analytical solution $\theta_1'\sim\theta_6'$ of the inverse kinematics of the six-degree-of-freedom serial robot with a non-offset wrist;

B. use the analytical solution $\theta_1'\sim\theta_6'$ as an approximate solution of the inverse kinematics of the six-degree-of-freedom serial robot with an offset wrist and an initial point for calculation using an iteration method; obtain an approximate pose of the terminal coordinate frame according to a formula for obtaining a forward kinematics of the six-degree-of-freedom serial robot with an offset wrist;

C. obtain a pose increment dX of the expected pose of the terminal coordinate frame with respect to the approximate pose of the terminal coordinate frame through calculation, and calculate a synthetic error e of the pose of the terminal coordinate frame by using dX;

D. judge whether the synthetic error e is within a reasonable error range or not; if the synthetic error is within the reasonable error range, stop and return a current numerical solution of the joint variable as an iterative numerical solution of the inverse kinematics of the six-degree-of-freedom serial robot with an offset wrist; if the synthetic error e is not within the reasonable error range, obtain the joint variable θ' through a jacobian matrix of the six-degree-of-freedom serial robot with an offset wrist, and put the new joint variable θ' into step B and step C to conduct iterative calculation until the synthetic error e is within the reasonable error range or a maximum number of iterations is reached, and return a current numerical solution of the joint variable as the iterative numerical solution of the inverse kinematics of the six-degree-of-freedom serial robot with an offset wrist.

Further, in addition, before step A:establish a base coordinate frame by using an intersection point of the rotation axis of the first joint and the rotation axis of the second joint of the six-degree-of-freedom serial robot with a non-offset wrist as an original point, using a straight line where the rotation axis of the first joint is located as a Z axis of the coordinate frame, and use a straight line where the rotation axis of the second joint is located as a Y axis; establish the coordinate frames, such as coordinate systems{0} {1} {2} {3} {4} { 5 }and coordinate frame{6}, from the base towards the terminal coordinate frame of the robot in sequence according to the six-degree-of-freedom, wherein the coordinate frame {0} is the base coordinate frame, and the coordinate frame {6} is the terminal coordinate frame.

Further, the step A comprises the following steps:

A1. set the expected original point of the terminal coordinate frame {6} of the six-degree-of-freedom serial robot with an offset wrist as($X_d$, $Y_d$, $Z_d$); set the expected pose matrix of the terminal coordinate frame {6} as $R_{XYZ}(\alpha_d, \beta_d, \gamma_d)$; set the base coordinate frame {0} as a reference frame; use the pose of the terminal coordinate frame of the six-degree-of-freedom serial robot with an offset wrist as the pose of the terminal coordinate frame of the six-degree-of-freedom serial robot with a non-offset wrist; use a method to obtain the analytical solution $\theta_1'\sim\theta_6'$ of the inverse kinematics of the six-degree-of-freedom serial robot with a non-offset wrist; calculate former three angles $\theta_1'$, $\theta_2'$ and $\theta_3'$ of the inverse kinematics firstly: as the non-offset wrist meets Pieper criterion, and according to homogeneous transformation matrixes between coordinate frames:

$$^0P_{4org} = \begin{bmatrix} g_1\cos\theta_1' + g_2\sin\theta_1' \\ g_1\sin\theta_1' - g_2\sin\theta_1' \\ g_3 \\ 1 \end{bmatrix} = \begin{bmatrix} X_d \\ Y_d \\ Z_d \\ 1 \end{bmatrix},$$

wherein $\begin{cases} g_1 = d_4\sin(\theta_2' + \theta_3') + a_2\cos\theta_2' \\ g_2 = d_2 + d_3 \\ g_3 = a_2\sin\theta_2' - d_4\cos(\theta_2' + \theta_3') \end{cases}$, obtain the analytical solution of $\theta_k'$, $\theta_2'$ and $\theta_3'$ through solving the equations above, wherein $$^0P_{4org} = \begin{bmatrix} X_d \\ Y_d \\ Z_d \\ 1 \end{bmatrix}$$

is a position vector of the non-offset wrist point, $a_2$ is the distance from the Z axis of the coordinate frame {2} to the Z axis of the coordinate frame {3} along the X axis of the coordinate frame {2}, $d_2$ is the distance from the X axis of the coordinate frame {1} to the X axis of the coordinate frame {2} along the Z axis of the coordinate frame {2}, $d_3$ is the distance from the X axis of the coordinate frame {2} to the X axis of the coordinate frame {3} along the Z axis of the coordinate frame {3}, and $d_4$ is the distance from the X axis of the coordinate frame {3} to the X axis of the coordinate frame {4} along the Z axis of the coordinate frame {4};

A2. obtain the last three angles $\theta_4'$, $\theta_5'$ and $\theta_6'$ of the inverse kinematics of the six-degree-of-freedom serial robot with a non-offset wrist by using a transformation matrix $R_{XYZ}(\alpha_d, \beta_d, \gamma_d)$ with Euler angles $XYZ(\alpha_d, \beta_d, \gamma_d)$:

$$R_{XYZ}(\alpha_d, \beta_d, \gamma_d) = {}_4^0R|_{\theta_4'=0}\ {}_6^4R|_{\theta_4\theta_5'=\theta_6'=0}\ {}_E^6R_{XYZ}(\theta_4', \theta_5', \theta_6').$$

wherein $_4^0R$ is a rotation matrix of the coordinate frame {4} with respect to the base coordinate frame {0}, $_6^4R$ is a rotation matrix of the coordinate frame {6} with respect to the coordinate frame {4}, and $_E^6R_{XYZ}$ is a rotation matrix of the coordinate frame {6} obtained after rotation of last three rotation axes; obtain the matrix of $_E^6R_{XYZ}(\theta_4', \theta_5', \theta_6')$ through calculating the formula above, and when $\cos\theta_5' \neq 0$, the analytic solution of $\theta_4'$, $\theta_5'$ and $\theta_6'$ can be obtained.

Further, the step B comprises the following steps:

B1. use the analytical solution $\theta_1' \sim \theta_6'$ of the inverse kinematics of the six-degree-of-freedom serial robot with a non-offset wrist obtained in step A as the approximate solution of the inverse kinematics of the six-degree-of-freedom serial robot with an offset wrist and the initial point for iteration: according to the matrix formula of the forward kinematics of the six-degree-of-freedom serial robot with an offset wrist:

$$^0_6T = {}^0_1T(\theta_1')\ {}^1_2T(\theta_2')\ {}^2_3T(\theta_3')\ {}^3_4T(\theta_4')\ {}^4_5T(\theta_5')\ {}^5_6T(\theta_6') = \begin{bmatrix} n_x & o_x & a_x & X_c \\ n_y & o_y & a_y & Y_c \\ n_z & o_z & a_z & Z_c \\ 0 & 0 & 0 & 1 \end{bmatrix},$$

wherein, the Euler angles $$R_{XYZ}(\alpha_c, \beta_c, \gamma_c) = \begin{bmatrix} n_x & o_x & a_x \\ n_y & o_y & a_y \\ n_z & o_z & a_z \end{bmatrix},$$

obtain the approximate position $(X_c, Y_c, Z_c)$ of the original point of the terminal coordinate frame {6} and the approximate pose matrix $R_{XYZ}(\alpha_c, \beta_c, \gamma_c)$ of the terminal coordinate frame {6} by solving the formula above.

Further, the step C comprises the following steps:

C1. obtain a position increment dP of the original point of the terminal coordinate frame {6} according to the expected position $(X_d, Y_d, Z_d)$ of the original point of the terminal coordinate frame {6} and the approximate position $(X_c, Y_c, Z_c)$ of the original point of the terminal coordinate frame {6};

C2. obtain a pose rotation increment dAng of the terminal coordinate frame {6} according to the rotation relation between the expected pose matrix $R_{XYZ}(\alpha_d, \beta_d, \gamma_d)$ of the terminal coordinate frame {6} and the approximate pose matrix $R_{XYZ}(\alpha_c, \beta_c, \gamma_c)$ of the terminal coordinate frame {6};

C3. combine the position increment dP of the original point of the terminal coordinate frame and the rotation increment dAng of the pose of the terminal coordinate frame into a differential motion dX of Cartesian space, which is represented as $$dX = \begin{bmatrix} dP \\ dAng \end{bmatrix},$$

and define the synthetic error of the pose of the terminal coordinate frame as $e = \|dP\|^2 + \|dAng\|^2$.

Further, the step D comprises the following steps:

D1. judge whether the synthetic error e is within a reasonable error range or not in step C above, if the synthetic error e is within the reasonable error range, stop the iteration and return a current numerical solution of the joint variable as the iterative numerical solution of the inverse kinematics of the six-degree-of-freedom serial robot with an offset wrist; if the synthetic error is not within the reasonable error range, proceeding with step D2;

D2. calculated $\theta$ by using a jacobian matrix J of the six-degree-of-freedom serial robot with an offset wrist through $dX = Jd\theta$, which is as follows:

$$d\theta = J^{-1}dX,$$

obtain the joint variable $\theta' = \theta' + d\theta$, and put the new joint variable $\theta'$ into step B1 to conduct iterative calculation until e is within the reasonable error range or the maximum number of iterations is reached, and return the current numerical solution of the joint variable as the iterative numerical solution of the inverse kinematics of the six-degree-of-freedom serial robot with an offset wrist.

The present disclosure has the beneficial effects that: the algorithm skillfully uses the analytical solution of the inverse kinematics of the six-degree-of-freedom serial robot with a non-offset wrist as the approximate solution of the inverse kinematics of the six-degree-of-freedom serial robot with an offset wrist to obtain the approximate pose; the error between the approximate pose and the expected pose is calculated and use an equivalent axial angle to represent the pose rotation increment between the approximate pose of the terminal coordinate frame and the expected pose. Use the jacobian matrix J to obtain the joint variable increment $d\theta'$, so as to obtain the new iteration point. The iterative calculation continues after obtaining the forward kinematics of the six-degree-of-freedom serial robot with an offset wrist so that the iteration point is continuously updated and obtain the numerical solution of the inverse kinematics meeting the actual accuracy requirement finally. The algorithm has less calculation amount, faster convergence, and higher efficiency, and has less burden for a robot controller. This method can increase the response speed, and has better real-time performance.

When the algorithm selects the initial point for the iterative method, the initial iterative point is specifically selected around the expected numerical solution of the inverse kinematics of the six-degree-of-freedom serial robot with an offset wrist on the basis of the inverse kinematics of the six-degree-of-freedom serial robot with a non-offset wrist, which has the advantages as follows: Firstly, it can be guaranteed that the iteration is converged to adjacent expected numerical solution so as to effectively avoid the iteration from converging to other unreasonable inverse kinematics. Secondly, the algorithm has less calculation amount, faster iteration convergence, higher efficiency, less computation burden for the robot controller. This method provides quick real-time computation response, and can increase the efficiency. Thirdly, both the robot with an offset wrist in the drawings and other six-degree-of-freedom serial robots not meeting the Pieper criterion can make use of this method to obtain numerical solutions of inverse kinematics. Therefore, the algorithm can also be used for obtaining numerical solutions of the inverse kinematics of other six-degree-of-freedom serial robot with an offset wrist.

BRIEF DESCRIPTION OF THE DRAWINGS

The present disclosure is further described hereinafter with reference to the drawings and the embodiments.

DETAILED DESCRIPTION

Figure 1:
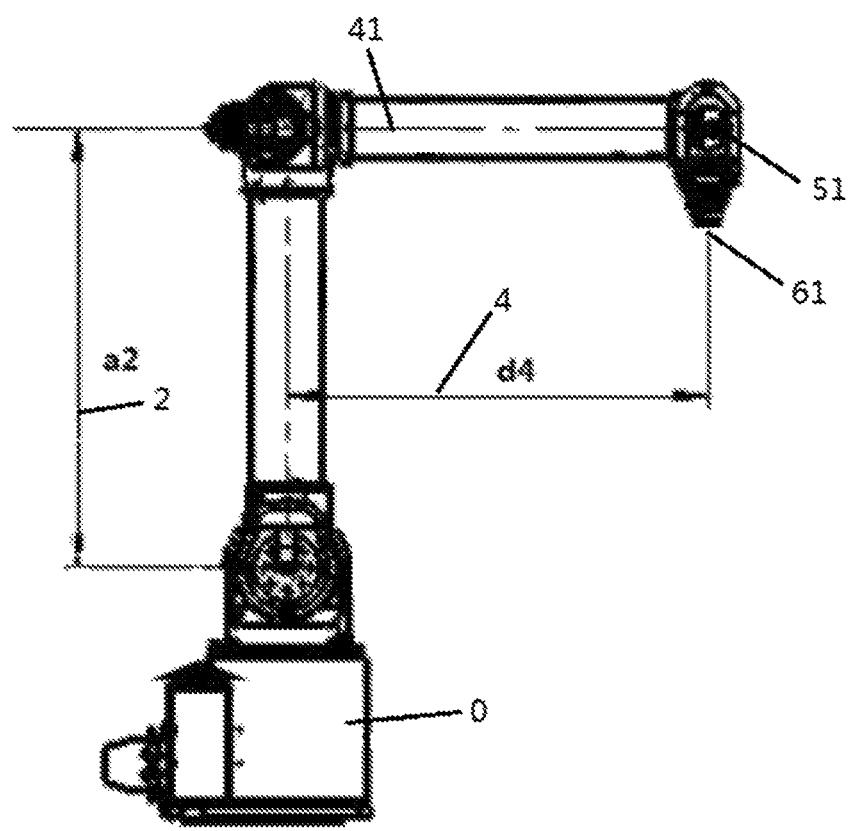
FIG. 1 is a front view of a six-degree-of-freedom serial robot with an offset wrist according to the present disclosure.
Figure 2:
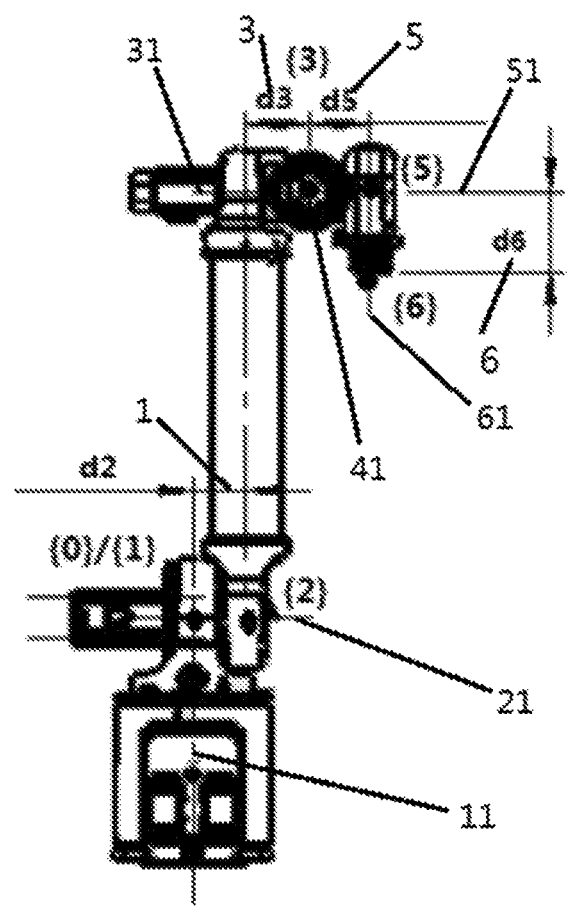
FIG. 2 is a side view of the six-degree-of-freedom serial robot with an offset wrist according to the present disclosure.

As shown in FIG. 1 and FIG. 2, a six-degree-of-freedom serial robot with an offset wrist according to the present disclosure comprises a base 0, a first joint 11 that connects to the base 0, a second joint 21 by a linkage 1, a third joint 31 that connects to the second joint 21 by a linkage 2, a fourth joint 41 that connects to the third joint 31 by a linkage 3 and linkage 4, a fifth joint 51 that connects to the fourth joint 41 by a linkage 5, a sixth joint 61 that connects to the fifth joint 51 by a linkage 6.

Figure 3:
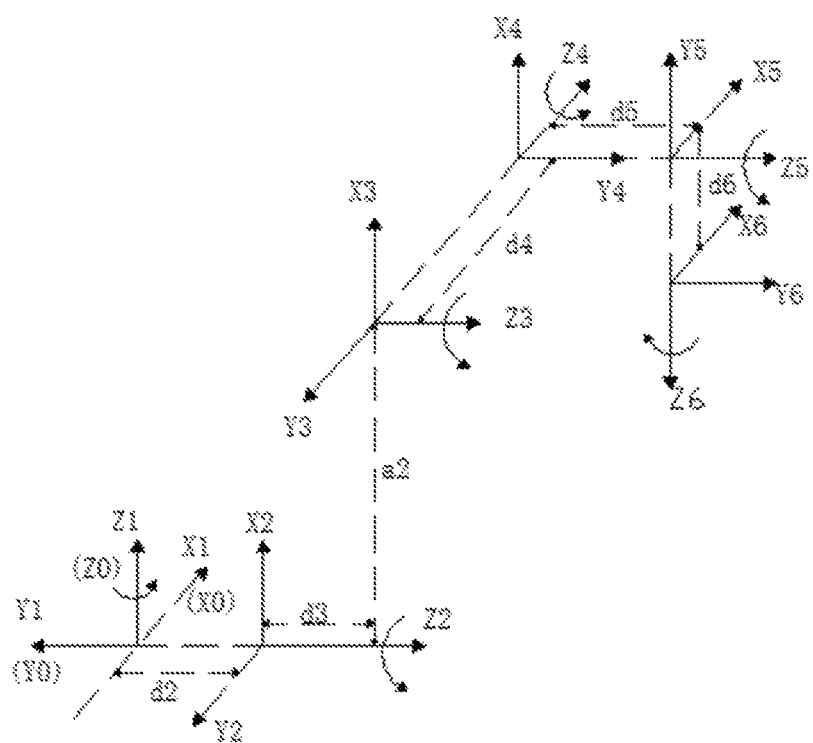
FIG. 3 is a schematic diagram of a spatial coordinate frame established according to the six-degree-of-freedom serial robot with an offset wrist related in the present disclosure.

FIG. 3 shows a schematic diagram of spatial coordinates established according to the six-degree-of-freedom serial robot with an offset wrist of FIGS. 1 and 2. A base coordinate frame is established by utilizing the intersection point of a rotation axis of the first joint 11 and the rotation axis of the second joint 21 as an original point, a straight line where the rotation axis of the first joint 11 is located as Z axis of the base coordinate frame, a straight line where the rotation axis of the second joint 21 is located as a Y axis of the base coordinate frame. The coordinate frames are established from the base towards the terminal coordinate frame of the robot in sequence, i.e., coordinate frame {0} to coordinate frame {6}, the coordinate frame {0} is the base coordinate frame, and the coordinate frame {6} is the terminal coordinate frame.

Figure 4:
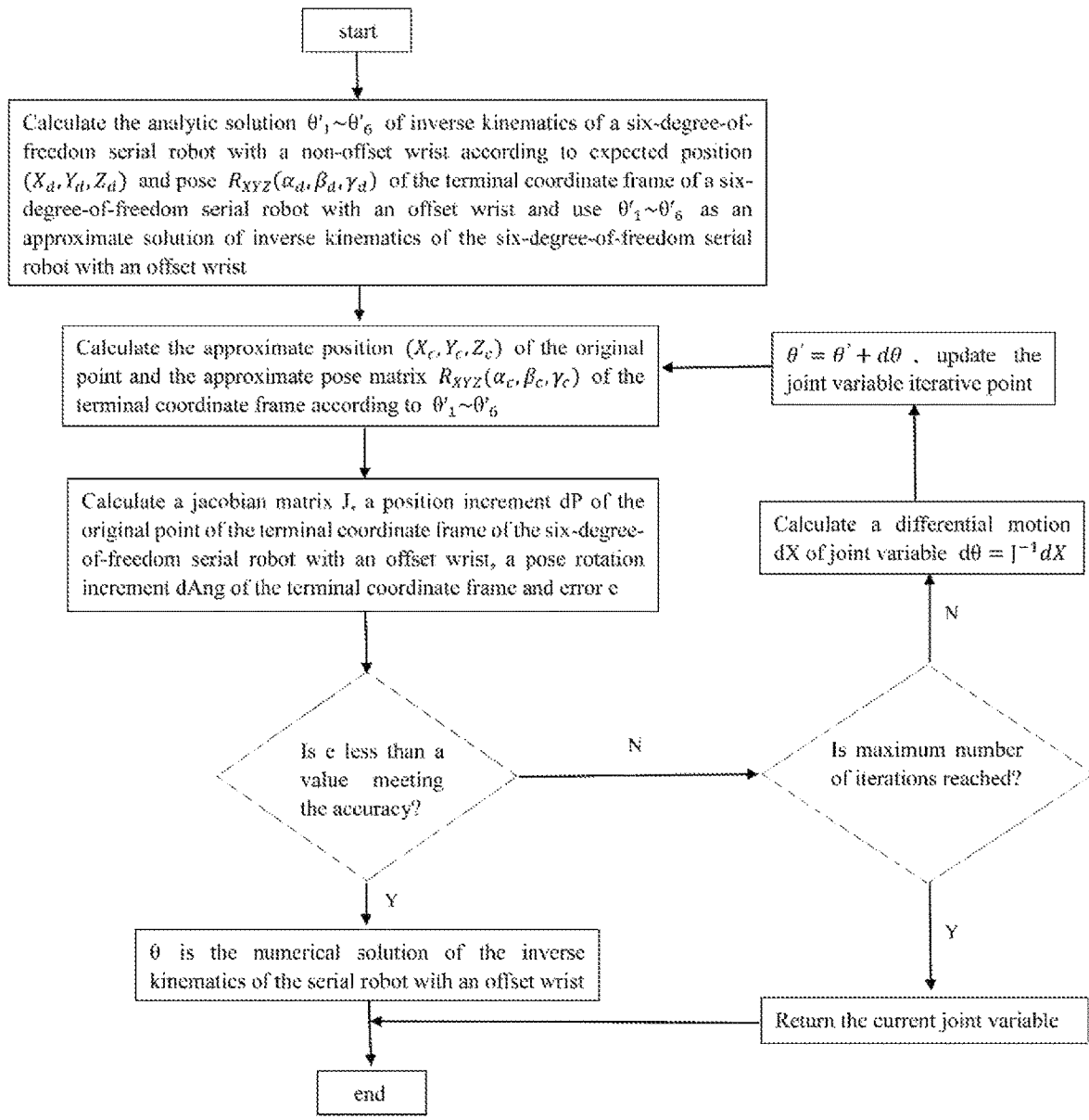
FIG. 4 is a flow chart of an algorithm of the present disclosure.

As shown in FIG. 4, the inverse kinematics calculation method of a six-degree-of-freedom serial robot with an offset wrist comprises the following steps:

set a point where the tail end of a wrist of the six-degree-of-freedom serial robot with an offset wrist is located as ($X_d$, $Y_d$, $Z_d$), i.e., the original point of the terminal coordinate frame {6},set the base coordinate frame {0} as a reference frame, set the pose matrix as $R_{XYZ}(\alpha_d, \beta_d, \gamma_d)$, and use the pose of the terminal coordinate frame of the six-degree-of-freedom serial robot with an offset wrist as the pose of the terminal coordinate frame of the six-degree-of-freedom serial robot with a non-offset wrist, and use a method for obtaining the inverse kinematics of the six-degree-of-freedom serial robot with a non-offset wrist, to obtain the analytical solution ($\theta_1'$~$\theta_6'$) of the inverse kinematics of the six-degree-of-freedom serial robot with a non-offset wrist. Calculate the former three angles $\theta_1'$, $\theta_2'$ and $\theta_3'$ of the inverse kinematics firstly; as the non-offset wrist meets the Pieper criterion, and according to transformation matrix of the coordinate frame {1} with respect to the coordinate frame {0}, transformation matrix of the coordinate frame {2} with respect to the coordinate frame {1}, and transformation matrix of the coordinate frame {3} with respect to the coordinate frame {2}:

$$^0P_{4org} = {}^0_1T(\theta_1') {}^1_2T(\theta_2') {}^2_3T(\theta_3') {}^3P_{4org} = \begin{bmatrix} X_d \\ Y_d \\ Z_d \\ 1 \end{bmatrix},$$

by arranging the formula above, it can obtain that $$^0P_{4org} = \begin{bmatrix} g_1\cos\theta_1' + g_2\sin\theta_1' \\ g_1\sin\theta_1' - g_2\sin\theta_1' \\ g_3 \\ 1 \end{bmatrix},$$

wherein $\begin{cases} g_1 = d_4\sin(\theta_2' + \theta_3') + a_2\cos\theta_2' \\ g_2 = d_2 + d_3 \\ g_3 = a_2\sin\theta_2' - d_4\cos(\theta_2' + \theta_3') \end{cases}$, and $\theta_1'$, $\theta_2'$ and $\theta_3'$ can be obtained through solving the equations above wherein, $$^0P_{4org} = \begin{bmatrix} X_d \\ Y_d \\ Z_d \\ 1 \end{bmatrix}$$

is a vector of the point where the tail end of the wrist is located;

$a_2$ is the distance between the Z axis of the coordinate frame {2} and the Z axis of the coordinate frame {3} along the X axis of the coordinate frame {2};

$d_2$ is the distance between the X axis of the coordinate frame {1} and the X axis of the coordinate frame {2} along the Z axis of the coordinate frame {2};

$d_3$ is the distance between the X axis of the coordinate frame {2} and the X axis of the coordinate frame {3} along the Z axis of the coordinate frame {3};

$d_4$ is the distance between the X axis of the coordinate frame {3} and the X axis of the coordinate frame {4} along the Z axis of the coordinate frame {4};

use the transformation matrix $R_{XYZ}(\alpha_d, \beta_d, \gamma_d)$ with Euler angles $XYZ(\alpha_d, \beta_d, \gamma_d)$ to obtain the last three angles $\theta_4'$, $\theta_5'$ and $\theta_6'$ of the inverse kinematics of the six-degree-of-freedom serial robot with a non-offset wrist:

$$R_{XYZ}(\alpha_d, \beta_d, \gamma_d) = {}_4^0R|_{\theta_4'=0}\,{}_6^4R|_{\theta_4'=\theta_5'=\theta_6'=0}\,{}_E^6R_{XYZ}(\theta_4', \theta_5', \theta_6'),$$

wherein ${}_4^0R$ is a rotation matrix of the coordinate frame {4} with respect to the base coordinate frame {0}, ${}_6^4R$ is a rotation matrix of the coordinate frame {6} with respect to the base coordinate frame {4}, and ${}_E^6R_{xyz}$ is a rotation matrix of the coordinate frame {6} obtained after rotation of the last three rotation axes;

the solution process of the formula above is as follows:

$${}_E^6R_{XYZ}(\theta_4', \theta_5', \theta_6') = {}_6^4R|^{-1}_{\theta_4'=\theta_5'=\theta_6'=0}\,{}_4^0R|^{-1}_{\theta_4'=0}\,R_{XYZ}(\alpha_d, \beta_d, \gamma_d),$$

from which it can be obtained that:

$${}_E^6R_{XYZ}(\theta_4', \theta_5', \theta_6') = \begin{bmatrix} c_5c_6 & -c_5c_6 & s_5 \\ s_4s_5s_6 & -s_4s_5s_6+c_4c_6 & -s_4c_5 \\ -c_4s_5s_6+s_4s_6 & c_4s_5s_6+s_4c_6 & c_4c_5 \end{bmatrix},$$

wherein: $c_4 = \cos\theta_4'$, $s_4 = \sin\theta_4'$, $c_5 = \cos\theta_5'$, $s_5 = \sin\theta_5'$, and $c_6 = \cos\theta_6'$, $s_6 = \sin\theta_6'$.

AS $\theta_1'$, $\theta_2'$, and $\theta_3'$ are obtained, ${}_4^0R|_{\theta_4'=0}$ is obtained if $\theta_4'=0$; therefore, $\theta_4'$, $\theta_5'$ and $\theta_6'$ can be obtained through the transformation matrix $R_{XYZ}(\alpha_d, \beta_d, \gamma_d)$ with Euler angles $XYZ(\alpha_d, \beta_d, \gamma_d)$, and ${}_E^6R_{XYZ}(\theta_4', \theta_5', \theta_6')$ can be represented as the following form:

$${}_E^6R_{XYZ}(\theta_4', \theta_5', \theta_6') = \begin{bmatrix} r_{11} & r_{12} & r_{13} \\ r_{21} & r_{22} & r_{23} \\ r_{31} & r_{32} & r_{33} \end{bmatrix},$$

when $\cos\theta_5' \neq 0$, it can be obtained that the analytical expressions of $\theta_4'$, $\theta_5'$ and $\theta_6'$ are as follows:

$$\begin{cases} \theta_5' = \arctan2\left(r_{13}, \sqrt{r_{11}^2+r_{12}^2}\right) \\ \theta_4' = \arctan2\left(-\dfrac{r_{23}}{\cos\theta_5'}, \dfrac{r_{33}}{\cos\theta_5'}\right) \\ \theta_6' = \arctan2\left(-\dfrac{r_{12}}{\cos\theta_5'}, \dfrac{r_{11}}{\cos\theta_5'}\right) \end{cases}$$

The analytical solution $\theta_1' \sim \theta_6'$ of the inverse kinematics of the six-degree-of-freedom serial robot with an offset wrist can be obtained from the steps above, and the analytical solution is used as the approximate solution of the inverse kinematics of the six-degree-of-freedom serial robot with an offset wrist and the initial point for iteration.

Use the approximate solution $\theta_1' \neq \theta_6'$ of the inverse kinematics of the six-degree-of-freedom serial robot with an offset wrist obtained through the calculating steps above and according to the matrix of the forward kinematics of the six-degree-of-freedom serial robot with an offset wrist:

$${}_6^0T = {}_1^0T(\theta_1'){}_2^1T(\theta_2'){}_3^2T(\theta_3'){}_4^3T(\theta_4'){}_5^4T(\theta_5'){}_6^5T(\theta_6') = \begin{bmatrix} n_x & o_x & a_x & X_c \\ n_y & o_y & a_y & Y_c \\ n_z & o_z & a_z & Z_c \\ 0 & 0 & 0 & 1 \end{bmatrix},$$

wherein:

$${}_1^0T(\theta_1') = \begin{bmatrix} \cos\theta_1' & -\sin\theta_1' & 0 & 0 \\ \sin\theta_1' & \cos\theta_1' & 0 & 0 \\ 0 & 0 & 1 & 0 \\ 0 & 0 & 0 & 1 \end{bmatrix},$$

$${}_2^1T(\theta_2') = \begin{bmatrix} \cos\theta_2' & -\sin\theta_2' & 0 & 0 \\ 0 & 0 & -1 & -d_2 \\ \sin\theta_2' & \cos\theta_2' & 0 & 0 \\ 0 & 0 & 0 & 1 \end{bmatrix},$$

$${}_3^2T(\theta_3') = \begin{bmatrix} \cos\theta_3' & -\sin\theta_3' & 0 & a_2 \\ \sin\theta_3' & \cos\theta_3' & 0 & 0 \\ 0 & 0 & 1 & d_3 \\ 0 & 0 & 0 & 1 \end{bmatrix},$$

$${}_4^3T(\theta_4') = \begin{bmatrix} \cos\theta_4' & -\sin\theta_4' & 0 & 0 \\ 0 & 0 & -1 & -d_4 \\ \sin\theta_4' & \cos\theta_4' & 0 & 0 \\ 0 & 0 & 0 & 1 \end{bmatrix},$$

$${}_5^4T(\theta_5') = \begin{bmatrix} \cos\theta_5' & -\sin\theta_5' & 0 & 0 \\ 0 & 0 & 1 & d_5 \\ -\sin\theta_5' & -\cos\theta_5' & 0 & 0 \\ 0 & 0 & 0 & 1 \end{bmatrix},$$

$${}_6^5T(\theta_6') = \begin{bmatrix} \cos\theta_6' & -\sin\theta_6' & 0 & 0 \\ 0 & 0 & -1 & -d_6 \\ \sin\theta_6' & \cos\theta_6' & 0 & 0 \\ 0 & 0 & 0 & 1 \end{bmatrix},$$

$$R_{XYZ}(\alpha_c, \beta_c, \gamma_c) = \begin{bmatrix} n_x & o_x & a_x \\ n_y & o_y & a_y \\ n_z & o_z & a_z \end{bmatrix},$$

wherein:

$d_5$ is the distance between the X axis of the coordinate frame {4} and the X axis of the coordinate frame {5} along the Z axis of the coordinate frame {5};

$d_6$ is the distance between the X axis of the coordinate frame {5} and the X axis of the coordinate frame {6} along the Z axis of the coordinate frame {6}.

The approximate position $(X_c, Y_c, Z_c)$ of the original point of the terminal coordinate frame and the approximate pose matrix $R_{XYZ}(\alpha_c, \beta_c, \gamma_c)$ are obtained through solving the formula above.

$(X_d, Y_d, Z_d)$ is the expected position of the original point of the terminal coordinate frame and $R_{XYZ}(\alpha_d, \beta_d, \gamma_d)$ is the expected pose matrix of the terminal coordinate frame. $(X_c, Y_c, Z_c)$ is the approximate position of the original point of the terminal coordinate frame and $R_{XYZ}(\alpha_c, \beta_c, \gamma_c)$ is the approximate pose matrix of the terminal coordinate frame, which can be obtained from the steps above. Assuming that the position increment dP of the original point of the terminal coordinate frame and the rotation increment dAng of the pose of the terminal coordinate frame are replaced with a differential motion dX of Cartesian space, which can be represented as:

$$dX = \begin{bmatrix} dP \\ dAng \end{bmatrix},$$

the position increment $dP=[X_d-X_c, Y_d-Y_c, Z_d-Z_c]$, and the rotation increment dAng is calculated as follows:

Let vector $K(k_x, k_y, k_z)$ be the vector respectively passing through the original point of the terminal coordinate frame; assuming that the terminal coordinate frame rotates by an angle $\varphi$ around K axis at a constant speed, which rotates from the Euler angles $XYZ(\alpha', \beta', \gamma')$ of the approximate pose to the expected pose angle $XYZ(\alpha_d, \beta_d, \gamma_d)$ of the terminal coordinate frame, then:

$$R(K, \varphi) = R_{XYZ}^{-1}(\alpha_c, \beta_c, \gamma_c) R_{XYZ}(\alpha_d, \beta_d, \gamma_d) =$$

$$\begin{bmatrix} k_xk_xv + \cos\varphi & k_xk_yv - k_z\sin\varphi & k_xk_zv + k_y\sin\varphi \\ k_xk_yv + k_z\sin\varphi & k_yk_yv + \cos\varphi & k_yk_zv - k_x\sin\varphi \\ k_xk_zv - k_y\sin\varphi & k_yk_zv + k_x\sin\varphi & k_zk_zv + \cos\varphi \end{bmatrix} = \begin{bmatrix} r'_{11} & r'_{12} & r'_{13} \\ r'_{21} & r'_{22} & r'_{23} \\ r'_{31} & r'_{32} & r'_{33} \end{bmatrix},$$

wherein $v = 1 - \cos\varphi$, through calculating the formula above, dAng is obtained:

$$dAng = \frac{1}{2\sin\varphi} \begin{bmatrix} r'_{32} - r'_{23} \\ r'_{13} - r'_{31} \\ r'_{21} - r'_{12} \end{bmatrix}.$$

In order to describe the deviation(dP, dAng) between the current approximate pose of the terminal coordinate frame and the expected pose of the terminal coordinate frame, the synthetic error of the pose of the terminal coordinate frame is defined as follows:

$$e = \|dP\|^2 + \|dAng\|^2.$$

According to the formula above and dP, dAng obtained above, judge whether the synthetic error e is within a reasonable range or not; if e is within a reasonable range, stop the iterative calculation, and return the current numerical solution of the joint variable as an iterative numerical solution of the inverse kinematics of the six-degree-of-freedom serial robot with an offset wrist; and if the synthetic error e is not within the reasonable range, then the iterative calculation continues.

Use the jacobian matrix $dX=Jd\theta$ of the six-degree-of-freedom serial robot with an offset wrist, wherein J is represented by the following formula:

$$J = \begin{pmatrix} {}^0Z_i \times ({}^0P_n - {}^0P_i) \\ {}^0Z_i \end{pmatrix}, i = 1, 2, 3, \ldots, 6, n = 6,$$

wherein, ${}^0Z_i$ is the vector representation of the $i^{th}$ rotation axis Z in the base coordinate frame, and ${}^0P_i$ is the vector representation of the original point of the coordinate frame {i} with respect to the base coordinate frame.

Through reversibility of the jacobian matrix, $d\theta=J^{-1}dX$ is obtained, so that the new joint variable $\theta'=\theta+d\theta$ can be calculated, and the new joint variable $\theta'$ is put into the matrix expression formula for obtaining the forward kinematics of the six-degree-of-freedom serial robot with an offset wrist, and the approximate position $(X_c, Y_c, Z_c)$ of the original point of the terminal coordinate frame and the approximate pose matrix $R_{XYZ}(\alpha_c, \beta_c, \gamma_c)$ of the terminal coordinate frame are updated:

$${}^0_6T = {}^0_1T(\theta_1')\,{}^1_2T(\theta_2')\,{}^2_3T(\theta_3')\,{}^3_4T(\theta_4')\,{}^4_5T(\theta_5')\,{}^5_6T(\theta_6').$$

Execute iterative calculation by repeating the steps to obtain the approximate pose and the synthetic error e above, until e is within the reasonable error range or the maximum number of iterations is reached, then return the current numerical solution of the joint variable as the iterative numerical solution of the inverse kinematics of the six-degree-of-freedom serial robot with an offset wrist.

The algorithm skillfully uses the analytical solution of the inverse kinematics of the six-degree-of-freedom serial robot with a non-offset wrist as the approximate solution of the inverse kinematics of the six-degree-of-freedom serial robot with an offset wrist to obtain the approximate pose; the error between the approximate pose and the expected pose is obtained and an equivalent axial angle is used to represent the pose rotation increment between the approximate pose and the expected pose of the terminal coordinate frame, and the joint variable increment $d\theta'$ is obtained according to the transformation relation between the differential motion dX of Cartesian space and the joint variable space motion $d\theta$, i.e., the jacobian matrix J, so as to obtain the new joint variable $\theta'=\theta'+d\theta$, which is used as a new iterative point. Through the iterative calculation of a formula for obtaining the forward kinematics of the six-degree-of-freedom serial robot with an offset wrist, the iterative point is continuously updated to approach the expected pose, so as to obtain the numerical solution of the inverse kinematics meeting the actual accuracy requirement finally. The algorithm has less calculation amount, faster convergence, higher efficiency, less burden to a robot controller and this method provides better real-time performance and can improve the efficiency.

The contents above are only preferred embodiments of the present disclosure, and the present disclosure is not limited to the embodiments. Any solution with the same technical effects by the same means shall all fall within the protection range of the present disclosure.

Without further elaboration, it is believed that one skilled in the art can, using the preceding description, utilize the present invention to its fullest extent. The preceding preferred specific embodiments are, therefore, to be construed as merely illustrative, and not limitative of the remainder of the disclosure in any way whatsoever.

In the foregoing and in the examples, all temperatures are set forth uncorrected in degrees Celsius and, all parts and percentages are by weight, unless otherwise indicated.

The entire disclosures of all applications, patents and publications, cited herein and of corresponding Chinese application No. 201710969628.6, filed Oct. 18, 2017are incorporated by reference herein.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A numerical method for obtaining the inverse kinematics of a six-degree-of-freedom serial robot with an offset wrist, comprising the following steps:

A. use the pose of the terminal coordinate frame of the six-degree-of-freedom serial robot with an offset wrist as the pose of the terminal coordinate frame of a six-degree-of-freedom serial robot with a non-offset wrist to obtain an analytical solution $\theta'_1 \sim \theta'_6$ of the inverse kinematics of the six-degree-of-freedom serial robot with a non-offset wrist;

B. use the analytical solution $\theta_1' \sim \theta_6'$ as an approximate solution of the inverse kinematics of the six-degree-of-freedom serial robot with an offset wrist and an initial point for iterative calculation using an iteration method; use $\theta_1' \sim \theta_6'$ to obtain the approximate pose of the terminal coordinate frame according to a formula for obtaining the forward kinematics of the six-degree-of-freedom serial robot with an offset wrist;

C. obtain a pose increment dX of the expected pose of the terminal coordinate frame with respect to the approximate pose of the terminal coordinate frame through calculation, and obtain the synthetic error e of the pose of the terminal coordinate frame by using dX;

D. judge whether the synthetic error e is within a reasonable error range or not; if the synthetic error is within the reasonable error range, stop and return the current numerical solution of the joint variable as an iterative numerical solution of the inverse kinematics of the six-degree-of-freedom serial robot with an offset wrist; if the synthetic error e is not within the reasonable error range, obtain the joint variable θ' through a jacobian matrix of the six-degree-of-freedom serial robot with an offset wrist, and put the new joint variable θ' into step B and step C to conduct iterative calculation until the synthetic error e is within the reasonable error range or the maximum number of iterations is reached and then return a current numerical solution of the joint variable as the iterative numerical solution of the inverse kinematics of the six-degree-of-freedom serial robot with an offset wrist.

2. The numerical method for obtaining the inverse kinematics of a six-degree-of-freedom serial robot with an offset wrist according to claim 1, further comprising before step A: establish a base coordinate frame by using an intersection point of a rotation axis of a first joint and a rotation axis of a second joint of the six-degree-of-freedom serial robot with a non-offset wrist as the original point, using a straight line where the rotation axis of the first joint is located as a Z axis of the base coordinate frame, and using a straight line where the rotation axis of the second joint is located as a Y axis; establish the coordinate frame {0} {1} {2} {3} {4} {5} and coordinate frame {6}, from the base coordinate frame towards the terminal coordinate frame of the robot in sequence according to the six-degree-of-freedom, wherein the coordinate frame {0} is the base coordinate frame, and the coordinate frame {6} is the terminal coordinate frame.

3. The numerical method for obtaining the inverse kinematics of a six-degree-of-freedom serial robot with an offset wrist according to claim 1, wherein step A comprises the following steps:

A1. set the expected original point of the terminal coordinate frame {6} of the six-degree-of-freedom serial robot with an offset wrist as $(X_d, Y_d, Z_d)$, and set the expected pose matrix of the terminal coordinate frame {6} as $R_{XYZ}(\alpha_d, \beta_d, \gamma_d)$, and set the base coordinate frame {0} as a reference coordinate frame; use the pose of the terminal coordinate frame of the six-degree-of-freedom serial robot with an offset wrist as the pose of the terminal coordinate frame of the six-degree-of-freedom serial robot with a non-offset wrist, and use a method to obtain the analytical solution $(\theta_1' \sim \theta_6')$ of the inverse kinematics of the six-degree-of-freedom serial robot with a non-offset wrist; calculate former three angles $\theta_1'$, $\theta_2'$ and $\theta_3'$ of the inverse kinematics firstly: as the non-offset wrist meets Pieper criterion, and according to homogeneous transformation matrixes between coordinate frames:

$$^0P_{4org} = \begin{bmatrix} g_1\cos\theta'_1 + g_2\sin\theta'_1 \\ g_1\sin\theta'_1 - g_2\sin\theta'_1 \\ g_3 \\ 1 \end{bmatrix} = \begin{bmatrix} X_d \\ Y_d \\ Z_d \\ 1 \end{bmatrix},$$

wherein $\begin{cases} g_1 = d_4\sin(\theta'_2 + \theta'_3) + a_2\cos\theta'_2 \\ g_2 = d_2 + d_3 \\ g_3 = a_2\sin\theta'_2 - d_4\cos(\theta'_2 + \theta'_3) \end{cases}$, obtain the analytical solution of $\theta_1'$, $\theta_2'$ and $\theta_3'$ through solving the equations above, wherein $$^0P_{4org} = \begin{bmatrix} X_d \\ Y_d \\ Z_d \\ 1 \end{bmatrix}$$

is a vector of the non-offset wrist point, $a_2$ is the distance from the Z axis of the coordinate frame {2} to the Z axis of the coordinate frame {3} along the X axis of the coordinate frame {2}, $d_2$ is the distance from the X axis of the coordinate frame {1} to the X axis of the coordinate frame {2} along the Z axis of the coordinate frame {2}, $d_3$ is the distance from the X axis of the coordinate frame {2} to the X axis of the coordinate frame {3} along the Z axis of the coordinate frame {3}, and $d_4$ is the distance from the X axis of the coordinate frame {3} to the X axis of the coordinate frame {4} along the Z axis of the coordinate frame {4};

A2. obtain the last three angles $\theta_4'$, $\theta_5'$ and $\theta_6'$ of the inverse kinematics of the six-degree-of-freedom serial robot with a non-offset wrist by using a transformation matrix $R_{XYZ}(\alpha_d, \beta_d, \gamma_d)$ which is based on the Euler angles $XYZ(\alpha_d, \beta_d, \gamma_d)$:

$R_{XYZ}(\alpha_d, \beta_d, \gamma_d) = {}^0_4R|_{\theta_4'=0} \, {}^4_6R|_{\theta_4'=\theta_5'=\theta_6'=0} \, {}_E^6R_{XYZ}(\theta_4', \theta_5', \theta_6')$, wherein ${}^0_4R$ is a rotation matrix of the coordinate frame {4} with respect to the base coordinate frame {0}, ${}^4_6R$ is a rotation matrix of the coordinate frame {6} with respect to the coordinate frame {4}, and ${}_E^6R_{xyz}$ is a rotation matrix of the coordinate frame {6} obtained after rotation of last three rotation axes; and obtain the matrix of ${}_E^6R_{XYZ}(\theta_4', \theta_5', \theta_6')$ through calculating the formula above, and when $\cos\theta_5' \neq 0$, the analytic solutions of $\theta_4'$, $\theta_5'$ and $\theta_6'$ can be obtained.

4. The numerical method for obtaining the inverse kinematics of a six-degree-of-freedom serial robot with an offset wrist according to claim 1, wherein step B comprises the following steps:

B1. use the analytical solution obtained in step A $\theta_1' \neq \theta_6'$ of the inverse kinematics of the six-degree-of-freedom serial robot with a non-offset wrist as the approximate solution of the inverse kinematics of the six-degree-of-freedom serial robot with an offset wrist and the initial point for iteration; according to the matrix expression formula of the forward kinematics of the six-degree-of-freedom serial robot with an offset wrist:

$$_6^0T = {}_1^0T(\theta_1')_2^1T(\theta_2')_3^2T(\theta_3')_4^3T(\theta_4')_5^4T(\theta_5')_6^5T(\theta_6') = \begin{bmatrix} n_x & o_x & a_x & X_c \\ n_y & o_y & a_y & Y_c \\ n_z & o_z & a_z & Z_c \\ 0 & 0 & 0 & 1 \end{bmatrix},$$

wherein, the Euler angles $$R_{XYZ}(\alpha_c, \beta_c, \gamma_c) = \begin{bmatrix} n_x & o_x & a_x \\ n_y & o_y & a_y \\ n_z & o_z & a_z \end{bmatrix},$$

obtain the approximate position $(X_c, Y_c, Z_c)$ of the original point of the terminal coordinate frame {6} and the approximate pose matrix $R_{XYZ}(\alpha_c, \beta_c, Y_c)$ of the terminal coordinate frame {6} by solving the formula above.

5. The numerical method for obtaining the inverse kinematics of a six-degree-of-freedom serial robot with an offset wrist according to claim 1, wherein step C comprises the following steps:
   C1. obtain a position increment dP of the original point of the terminal coordinate frame {6} according to the expected position $(X_d, Y_d, Z_d)$ of the original point of the terminal coordinate frame {6} and the approximate position $(X_c, Y_c, Z_c)$ of the original point of the terminal coordinate frame {6};
   C2. obtain a rotation increment dAng of the terminal coordinate frame {6} according to the rotation relation between the expected pose matrix $R_{XYZ}(\alpha_d, \beta_d, \gamma_d)$ of the terminal coordinate frame {6} and the approximate pose matrix $R_{XYZ}(\alpha_c, \beta_c, \gamma_c)$ of the terminal coordinate frame {6};
   C3. combine the position increment dP of the original point of the terminal coordinate frame and the rotation increment dAng of the pose of the terminal coordinate frame into a differential motion dX of Cartesian space, which is represented as $$dX = \begin{bmatrix} dP \\ dAng \end{bmatrix},$$

and define the synthetic error of the pose of the terminal coordinate frame as $e = \|dP\|^2 + \|dAng\|^2$.

6. The numerical method for obtaining the inverse kinematics of a six-degree-of-freedom serial robot with an offset wrist according to claim 1, wherein step D comprises the following steps:
   D1. judge whether the synthetic error e is within a reasonable error range or not by the step C above, if the synthetic error e is within the reasonable error range, stop the iteration and return a current numerical value of the joint variable as the iterative numerical solution of the inverse kinematics of the six-degree-of-freedom serial robot with an offset wrist; if the synthetic error is not within the reasonable error range, proceeding with step D2;
   D2. calculate dθ by using a jacobian matrix J of the six-degree-of-freedom serial robot with an offset wrist through dX=Jdθ, which is as follows:

$d\theta = J^{-1}dX,$ obtain the joint variable θ'=θ'+dθ, and put the new joint variable θ' into step B1 to conduct iterative calculation until e is within the reasonable error range or the maximum number of iterations is reached, and then return the current numerical solution of the joint variable as the iterative numerical solution of the inverse kinematics of the six-degree-of-freedom serial robot with an offset wrist.

* * * * *